United States Patent
Kim et al.

(10) Patent No.: US 8,134,529 B2
(45) Date of Patent: Mar. 13, 2012

(54) GATE DRIVER HAVING A PLURALITY OF FIRST STAGES AND SECOND STAGES FOR DRIVING A DISPLAY DEVICE AND DRIVING METHOD THEREOF

(75) Inventors: Sung-Man Kim, Seoul (KR); Bong-Jun Lee, Seoul (KR); Hong-Woo Lee, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 875 days.

(21) Appl. No.: 12/128,117

(22) Filed: May 28, 2008

(65) Prior Publication Data

US 2009/0096737 A1   Apr. 16, 2009

(30) Foreign Application Priority Data

Oct. 16, 2007 (KR) ........................ 10-2007-0103850

(51) Int. Cl.
*G09G 3/36* (2006.01)
(52) U.S. Cl. .......................................... 345/98; 345/100
(58) Field of Classification Search ............. 345/98–100
See application file for complete search history.

(56) References Cited

U.S. PATENT DOCUMENTS

| | | | |
|---|---|---|---|
| 2004/0217935 A1* | 11/2004 | Jeon et al. | 345/100 |
| 2006/0176265 A1* | 8/2006 | Kim et al. | 345/100 |
| 2006/0267911 A1* | 11/2006 | Jang | 345/100 |
| 2006/0279511 A1* | 12/2006 | Uh et al. | 345/100 |
| 2006/0284815 A1* | 12/2006 | Kwon et al. | 345/98 |
| 2006/0290644 A1* | 12/2006 | Kim | 345/100 |
| 2007/0001991 A1 | 1/2007 | Jang et al. | |
| 2007/0052658 A1* | 3/2007 | Kim | 345/100 |
| 2007/0104307 A1* | 5/2007 | Kim et al. | 377/64 |

* cited by examiner

*Primary Examiner* — Chanh Nguyen
*Assistant Examiner* — Long Pham
(74) *Attorney, Agent, or Firm* — Cantor Colburn LLP

(57) ABSTRACT

In a gate driver of a display device, a plurality of first stages each transmit a first gate signal having a first gate-on voltage to first gate lines, and a plurality of second stages each transmit a second gate signal having a second gate-on voltage to second gate lines and output a carry signal corresponding to the second gate signal. Each first stage outputs the first gate-on voltage based on a third gate-on voltage of the carry signal from a previous second stage, and each second stage outputs the second gate-on voltage based on the third gate-on voltage of the carry signal from the previous second stage.

25 Claims, 8 Drawing Sheets

GATE DRIVER HAVING A PLURALITY OF FIRST STAGES AND SECOND STAGES FOR DRIVING A DISPLAY DEVICE AND DRIVING METHOD THEREOF

This application claims priority to Korean Patent application No. 2007-103850, filed on Oct. 16, 2007, and all benefits accruing therefrom under 35 U.S.C. §119, the contents of which in its entirety are herein incorporated by reference.

BACKGROUND OF THE INVENTION (a) Field of the Invention

An aspect of the present invention relates to a display device, a driving device and a driving method thereof.

(b) Description of the Related Art

A liquid crystal display is one form of a flat panel display that is now widely used. Typically, the liquid crystal display includes two panels (e.g., upper and lower panels) in which field generating electrodes, such as pixel electrodes and common electrodes, are formed, with a liquid crystal layer interposed between the panels. During operation of the liquid crystal display, a voltage is applied to the field generating electrodes to generate an electric field in the liquid crystal layer, which determines the direction of liquid crystal molecules of the liquid crystal layer based on the generated electric field, and an image is displayed by controlling a polarization of incident light.

Among the various types of liquid crystal displays, a particular type of liquid crystal display operates in a vertically aligned ("VA") mode. This type of liquid crystal display has a large contrast ratio and a wide reference viewing angle, in which long axes of liquid crystal molecules are aligned in a direction which is perpendicular to planes of the upper and lower panels when an electric field is not being applied. In this case, the reference viewing angle refers to a viewing angle at which a contrast ratio is either 1:10 or a luminance inversion limit angle between grays.

Achieving a wide viewing angle in a liquid crystal display operating in a VA mode includes forming a cutout in a field generating electrode, and forming a protrusion above or below the field generating electrode. Here, since the directions in which the liquid crystal molecules are inclined can be determined by the cutouts and the protrusions, the directions in which the liquid crystal molecules are inclined are dispersed in various directions using the cutouts and the protrusions to increase the reference viewing angle.

It has been seen, however, that the liquid crystal display operating in the VA mode has a problem in that side visibility is inferior to front visibility. For example, in the case of a liquid crystal display having cutouts which operates in a patterned vertically aligned ("PVA") mode, an image becomes brighter one a viewer moves toward a side of the liquid crystal display so that there is no difference in luminance among high gray levels in a severe case and so that a picture generated by the liquid crystal display appears crumbled.

In order to account for this, individual pixels of the liquid crystal display are divided into two sub-pixels. The two sub-pixels are capacitively coupled with each other, and, therefore, an increased voltage is directly applied to one sub-pixel while a drop in voltage is caused in the other sub-pixel. Thus, the voltages of the two sub-pixels are made to be different from each other and, thus, the transmittances of the two sub-pixels are also made to be different from each other.

Due to the fact that the liquid crystal display of this example needs twice as many gate lines as compared with other liquid crystal displays, however, if the data voltages are applied with the general method, the pixels may not arrive at the object voltages due to associated short voltage charge times. As a result, polarity inversion becomes problematic. Accordingly, portions of the times that allow for the application of the gate-on voltages to the two neighboring gate lines need to be overlapped.

Here, it is noted that the timing of a gate signal applied to one sub-pixel and the timing of a gate signal applied to the other sub-pixel must be differently determined. However, since the portions of the times that allow for the application of the gate-on voltages to the two neighboring gate lines connected to each of the two sub-pixels need to be overlapped, the structure of the gate drivers is complicated.

BRIEF SUMMARY OF THE INVENTION

One exemplary embodiment of the present invention provides a driving device and a display device including the same which are each configured to apply the overlapping gate signals with a simple structure.

A display device according to an exemplary embodiment of the present invention includes a plurality of first gate lines, a plurality of second gate lines which are configured to each form a pair along with each of the first gate lines, and a gate driver which is configured to sequentially transmit a first gate signal having a first gate-on voltage to the first gate lines and to sequentially transmit a second gate signal having a second gate-on voltage to the second gate lines. The gate driver includes a plurality of first stages, with each first stage having a first output terminal configured to transmit the first gate signal to a corresponding first gate line from among each of the first gate lines, and a plurality of second stages, with each second stage having a second output terminal configured to transmit the second gate signal to a corresponding second gate line from among each of the second gate lines and a carry output terminal configured to output a carry signal in correspondence with the second gate signal. Each first stage outputs the first gate-on voltage to the first output terminal based on a third gate-on voltage of the carry signal from a previous second stage, and each second stage is configured to output the second gate-on voltage to the second output terminal based on the third gate-on voltage of the carry signal from a previous second stage.

A period of the second gate signal having the second gate-on voltage and a period of the first gate signal having the first gate-on voltage may be at least partially overlapped with each other.

The period of the second gate signal having the second gate-on voltage may be longer than the period of the first gate signal having the first gate-on voltage.

The display device may include a signal controller configured to output first to fourth clock signals which alternately have a first voltage and a second voltage. The first and second clock signals may be respectively inputted to first and second clock terminals of one of two neighboring first stages, and the second and first clock signals may be respectively inputted to first and the second clock terminals of the other of the two neighboring first stages, while the third and fourth clock signals may be respectively inputted to third and fourth clock terminals of one of two neighboring second stages, and the fourth and third clock signals may be respectively inputted to the third and fourth clock terminals of the other of the two neighboring second stages. Each first stage is configured to output the first gate-on voltage in synchronization with the first voltage of the first clock terminal, and each second stage is configured to output the second gate-on voltage in synchronization with the first voltage of the third clock terminal.

Cycles of the first to the fourth clock signals may be substantially similar with one another, a period having the first voltage of the first and second clock signals may be smaller than a period of the second voltage and a phase difference of the first and second clock signals may be approximately 180 degrees, and a duty ratio of the third and fourth clock signals may be approximately 50% and a phase difference of the third and fourth clock signals may be approximately 180 degrees.

The first voltage, the first gate-on voltage, and the second gate-on voltage may be substantially similar with one another, and the second voltage may be substantially similar with a gate-off voltage.

Each first stage may be configured to store the third gate-on voltage of the carry signal of the previous second stage and to output the first gate-on voltage based on the stored voltage in synchronization with the first voltage of the first clock terminal, and each second stage may be configured to store the third gate-on voltage of the carry signal of the previous second stage and to output the second gate-on voltage based on the stored voltage in synchronization with the first voltage of the third clock terminal.

Each first stage may be configured to output a gate-off voltage to the first output terminal in synchronization with the second voltage of the first clock terminal when the third clock terminal of the corresponding second stage is set at the first voltage.

Each first stage may be configured to discharge the stored voltage in synchronization with the second gate-on voltage of the second gate signal of a next second stage and to output a first gate-off voltage to the first output terminal, and each second stage may be configured to discharge the stored voltage in synchronization with the second gate-on voltage of the second gate signal of a next second stage and to output a second gate-off voltage to the second output terminal.

Each first stage may be configured to output the first gate-off voltage in synchronization with the first voltage of the second clock terminal, and each second stage may be configured to output the second gate-off voltage in synchronization with the first voltage of the fourth clock terminal.

Each first stage may include a first transistor, which is connected between the first output terminal and a first gate-off voltage, and is configured to turn the first transistor on in response to the first voltage of the third clock terminal unless a voltage of the first output terminal is the first gate-on voltage. Each second stage may include a second transistor, which is connected between the second output terminal and a second gate-off voltage, and which is configured to turn the second transistor on in response to the first voltage of the third clock terminal unless the voltage of the second output terminal is the second gate-on voltage.

Each first stage may include a first transistor connected between the first output terminal and a first gate-off voltage, and is configured to turn the first transistor on in response to the first voltage of the third clock terminal unless the voltage of the second output terminal of the corresponding second stage is the second gate-on voltage. Each second stage may include a second transistor, which is connected between the second output terminal and a second gate-off voltage, and which is configured to turn the second transistor on in response to the first voltage of the third clock terminal unless a voltage of the second output terminal is the second gate-on voltage.

Each first stage may include a first transistor connected between the first output terminal and a first gate-off voltage, and each second stage may include a second transistor, which is connected between the second output terminal and a second gate-off voltage, and which is configured to turn the first and second transistors on in response to the first voltage of the third clock terminal unless a voltage of the second output terminal is the second gate-on voltage.

The first gate line, the second gate line, and the gate driver may be integrated on one substrate.

According to yet another exemplary embodiment of the present invention, a driving device of a display device, the display device including a plurality of first gate lines configured to sequentially transmit a first gate signal having a first gate-on voltage, and a plurality of second gate lines configured to sequentially transmit a second gate signal having a second gate-on voltage, each of the plurality of the second gate lines respectively forming a pair with each of the first gate lines, is provided. The driving device may include a plurality of first stages each having a first output terminal which is configured to transmit the first gate signal to a corresponding first gate line from among each of the first gate lines, and a plurality of second stages each having a second output terminal configured to transmit the second gate signal to a corresponding second gate line from among each of the second gate lines, and a carry output terminal configured to output a carry signal corresponding to the second gate signal. Each first stage includes a first transistor connected between a first clock terminal and the first output terminal, and having a gate connected to a first junction point, a second transistor configured to transmit a third gate-on voltage to the first junction point in response to the third gate-on voltage of the carry signal of a previous second stage, and a first capacitor connected between a gate and a source of the first transistor, the first capacitor being configured to store the third gate-on voltage. Each second stage may include a third transistor connected between a second clock terminal and the second output terminal, and having a gate connected to a second junction point, a fourth transistor configured to transmit the third gate-on voltage to the second junction point in response to the third gate-on voltage of the carry signal of a previous second stage, a second capacitor connected between a gate and a source of the third transistor, the second capacitor being configured to store the third gate-on voltage, and a fifth transistor connected between the second clock terminal and the carry output terminal, and having a gate connected to the second junction point.

A first clock signal may be input to the first clock terminal of one of two neighboring first stages and a second clock signal may be input to the first clock terminal of the other of the two neighboring first stages, and a third clock signal may be input to the second clock terminal of one of two neighboring the second stages and a fourth clock signal may be input to the second clock terminal of the other of the two neighboring the second stages.

Cycles of the first to fourth clock signals may be substantially similar with one another and the first to fourth clock signals may alternately have the first voltage and the second voltage. A period having the first voltage of the first and second clock signals may be smaller than a period of the second voltage and a phase difference of the first and second clock signals may be approximately 180 degrees. A duty ratio of the third and fourth clock signals may be approximately 50% and a phase difference of the third and fourth clock signals may be approximately 180 degrees.

Each first stage may further include a sixth transistor configured to discharge the first capacitor in response to the second gate-on voltage of a next second stage, and a seventh transistor configured to transmit a gate-off voltage to the first output terminal in response to the second gate-on voltage of the next second stage. Each second stage may further include an eighth transistor configured to discharge the second capacitor in response to the second gate-on voltage of a next second stage, and a ninth transistor configured to transmit the gate-off voltage to the second output terminal in response to the second gate-on voltage of the next second stage.

Each first stage may further include a sixth transistor connected between a gate-off voltage and the first output terminal, and having a gate connected to a third clock terminal, and a seventh transistor connected between the first junction point and the first output terminal, and having a gate connected to the first clock terminal. Each second stage may further include an eighth transistor connected between the gate-off voltage and the second output terminal, and having a gate connected to a fourth clock terminal, and a ninth transistor connected between the second junction point and the second output terminal, and having a gate connected to the second clock terminal. The second clock signal may be input to the third clock terminal when the first clock signal is input to the first clock terminal, and the first clock signal is input to the third clock terminal when the second clock signal is input to the first clock terminal, the fourth clock signal may be input to the fourth clock terminal when the third clock signal is input to the second clock terminal, and the third clock signal is input to the fourth clock terminal when the fourth clock signal is input to the second clock terminal.

According to still another exemplary embodiment of the present invention, a driving method of a display device, the display device including a plurality of first gate lines configured to sequentially transmit a first gate signal having a first gate-on voltage, and a plurality of second gate lines configured to sequentially transmit a second gate signal having a second gate-on voltage, with each of the second gate lines respectively forming a pair with each of the first gate lines, is provided. The driving method includes storing a voltage corresponding to the second gate-on voltage during a period in which the second gate-on voltage is transmitted to an (i−1)-th second gate line, generating first and second gate-on voltages respectively transmitted to i-th first and second gate lines on the basis of the stored voltage, changing the first gate-on voltage output to the i-th first gate line to a gate-off voltage while maintaining the second gate-on voltage output to the i-th second gate line, and transmitting the gate-off voltage to the i-th first and second gate lines.

The generation of the first and second gate-one voltages may include generating the first gate-on voltage transmitted to the i-th first gate line in response to a first voltage of a first clock terminal, and generating the second gate-on voltage transmitted to the i-th second gate line in response to the first voltage of a second clock terminal. A first clock signal may be input to the first clock terminal when i is an odd number, a second clock signal may be input to the first clock terminal when i is an even number, a third clock signal may be input to the first clock terminal when i is an odd number, and a fourth clock signal may be input to the second clock terminal when i is an even number.

Cycles of the first to fourth clock signals may be substantially similar with one another and the first to the fourth clock signals may alternately have the first voltage and the second voltage. A period having the first voltage of the first and second clock signals may be smaller than a period of the second voltage and a phase difference of the first and second clock signals may be approximately 180 degrees. A duty ratio of the third and fourth clock signals may be approximately 50% and a phase difference of the third and fourth clock signals may be approximately 180 degrees.

The changing of the first gate-on voltage may include changing the first gate-on voltage to the gate-off voltage in synchronization with the second voltage of the first clock terminal.

The transmission of the gate-off voltage may include discharging the stored voltage in synchronization with the second gate-on voltage transmitted to the (i+1)-th second gate line, and transmitting the gate-off voltage to the i-th first and second gate lines.

The transmission of the gate-off voltage may further include transmitting the gate-off voltage to the i-th first gate line in response to the first voltage of the third clock terminal, and transmitting the gate-off voltage to the i-th second gate line in response to the first voltage of the fourth clock terminal. The second clock signal may be input to the third clock terminal when i is an odd number, the first clock signal may be input to the third clock terminal when i is an even number, the fourth clock signal may be input to the fourth clock terminal when i is an odd number, and the third clock signal may be input to the fourth clock terminal when i is an even number.

DETAILED DESCRIPTION OF THE INVENTION

Figure 1:
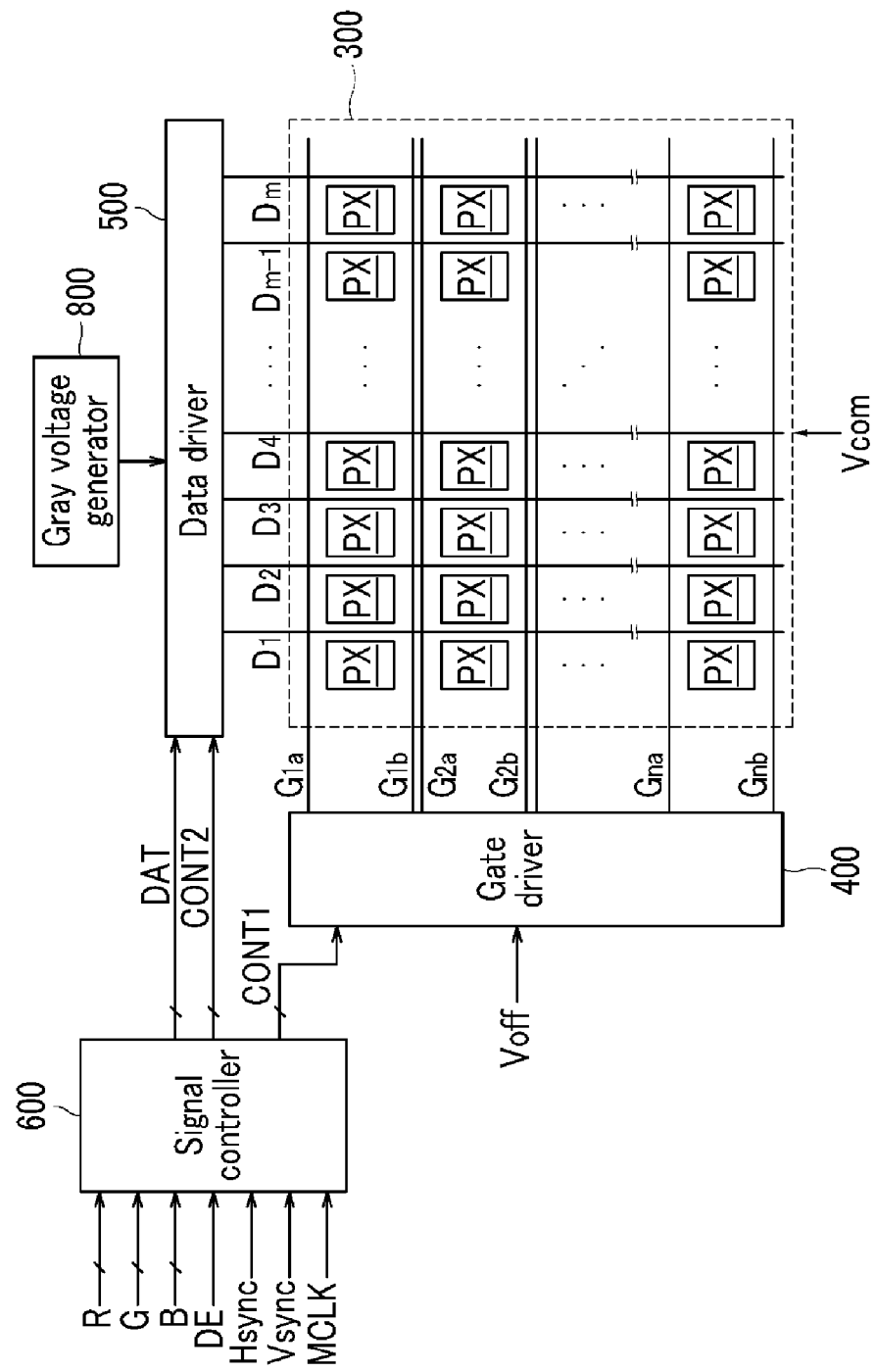
FIG. 1 is a block diagram of a liquid crystal display according to an exemplary embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

First, a display device according to an exemplary embodiment of the present invention will be described in detail with reference to FIGS. 1 and 2, and one exemplary embodiment of the display device is a liquid crystal display.

Figure 2:
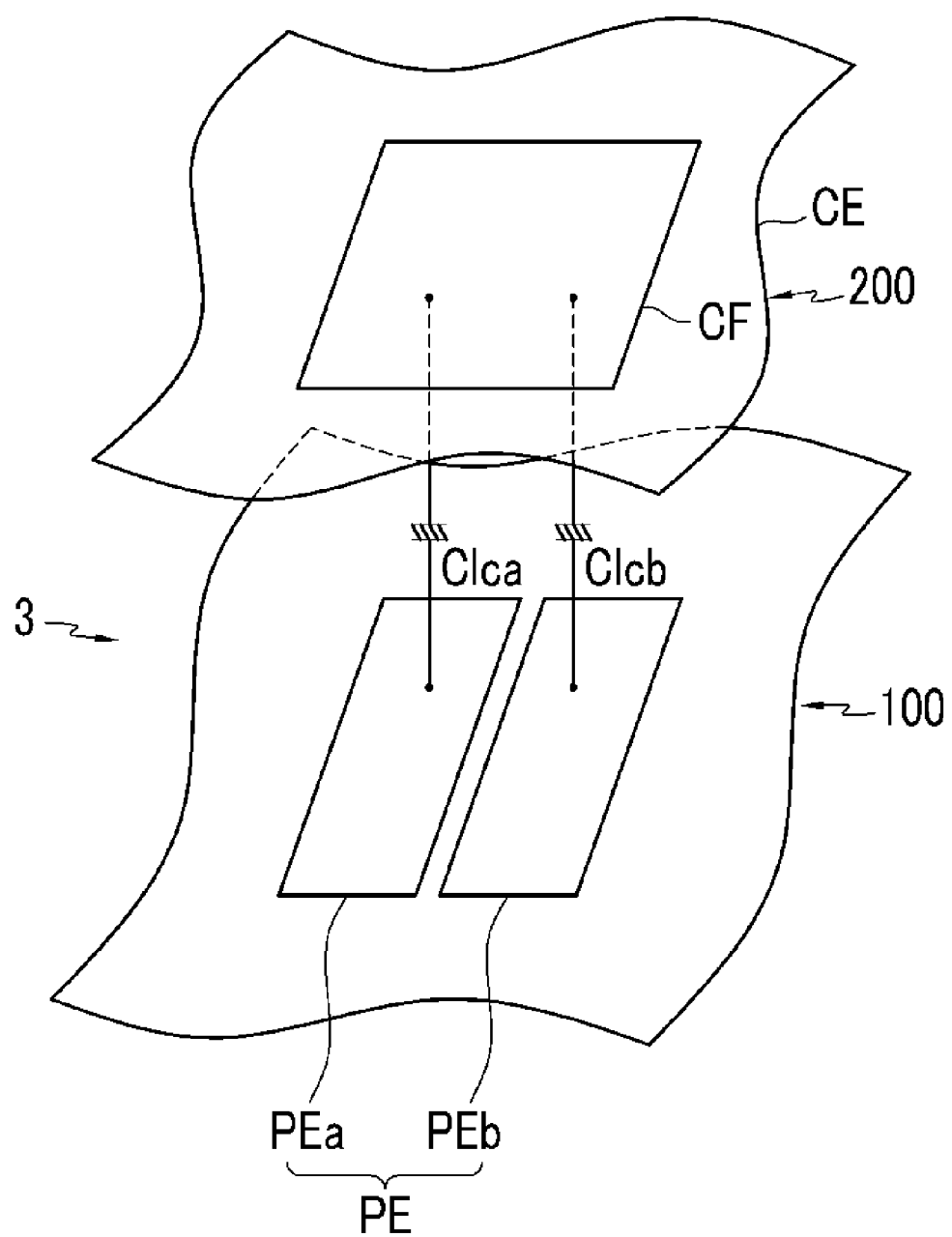
FIG. 2 is a circuit diagram of two sub-pixels in a liquid crystal display according to an exemplary embodiment of the present invention.

FIG. 1 is a block diagram of a liquid crystal display according to an exemplary embodiment of the present invention, and FIG. 2 is an equivalent circuit diagram of two sub-pixels in a liquid crystal display according to an exemplary embodiment of the present invention.

As shown in FIG. 1, a liquid crystal display according to an exemplary embodiment of the present invention includes a liquid crystal panel assembly 300, a gate driver 400 and a data driver 500. The gate driver 400 and the data driver 500 are each connected to the liquid crystal panel assembly 300. The liquid crystal display further includes a gray voltage generator 800 that is connected to the data driver 500, and a signal controller 600 that controls the gate driver 400, the data driver 500, and the gray voltage generator 800.

With reference now to FIGS. 1 and 2, it is noted that the liquid crystal panel assembly 300 includes a plurality of signal lines and a plurality of pixels PX that are connected to the plurality of signal lines. The plurality of pixels PX are each arranged in an approximately matrix-like format. The liquid crystal panel assembly 300 further includes lower and upper panels 100 and 200 that face each other, and a liquid crystal layer 3 that is interposed between the lower and upper panels 100 and 200.

The signal lines $G_{1a}$-$G_{nb}$ and $D_1$-$D_m$ are provided in the lower panel 100. The signal lines $G_{1a}$-$G_{nb}$ and $D_1$-$D_m$ include a plurality of gate lines $G_{1a}$-$G_{nb}$ that transmit gate signals (also referred to as "scanning signals") and a plurality of data lines $D_1$-$D_m$ that transmit data signals. The gate lines $G_{1a}$-$G_{nb}$ extend substantially in a first direction and are substantially parallel with one another, and the data lines $D_1$-$D_m$ extend substantially in a second direction and are parallel with one another. In an exemplary embodiment of the invention, the first direction and the second direction are perpendicular with respect to one another.

With reference now to FIG. 2, it is noted that each of the pixels PX includes a pair of sub-pixels, and that each sub-pixel includes liquid crystal capacitors Clca and Clcb. The two sub-pixels respectively include a switching element (not shown) that is connected to the gate line, the data line, and one of the liquid crystal capacitors Clca or Clcb.

In detail, a liquid crystal capacitor Clca/Clcb is structured to have a sub-pixel electrode PEa/PEb coupled to the lower panel 100 and a common electrode CE coupled to the upper panel 200 as two terminals. The liquid crystal capacitor Clca/Clcb is further structured to have the liquid crystal layer 3, between the sub-pixel electrode PEa/PEb and the common electrode CE, to serve as a dielectric material. Here, the sub-pixel electrode PEa/PEb includes the pair of sub-pixel electrodes PEa and PEb that are separated from each other form one pixel electrode PE. The common electrode CE is formed on a surface of the upper panel 200, and a common voltage Vcom is applied to the common electrode CE. The liquid crystal layer 3 has negative dielectric anisotropy, and liquid crystal molecules of the liquid crystal layer 3 may, therefore, be aligned such that their major axes are perpendicular to the surfaces of the lower and upper panels 100 and 200 when an electric field is not applied.

In order to realize a color image display for the liquid crystal panel assembly 300, each pixel PX either uniquely displays one of the primary colors (e.g., spatial division type of pixel PX) or temporally and alternately displays primary colors (e.g., temporal division type of pixel PX). Then, in both cases, the primary colors are spatially and temporally synthesized. Thus, a desired color, such as red, green and blue, is recognized. While FIG. 2 provides an illustration of an example of the spatial division type of pixel PX, in which each pixel PX has a color filter CF that represents one of the primary colors in a region of the upper panel 200, it is noted that, in other exemplary embodiments of the invention, the color filter CF may be formed above or below the sub-pixel electrode PE of the lower panel 100.

Polarizers (not shown) are provided on outer surfaces of the lower and upper panels 100 and 200, and the polarization axis of two polarizers may cross. In the case of a reflective liquid crystal display, one of two polarizers may be omitted. In a case of crossed polarizers, incident light on the liquid crystal layer 3 which does not have any electric field applied thereto is blocked.

Referring again to FIG. 1, the gate driver 400 is connected to the gate lines $G_{1a}$ to $G_{nb}$ of the liquid crystal panel assembly 300, and applies gate signals to the gate lines $G_{1a}$ to $G_{nb}$. The gate signals are obtained by combining a gate-on voltage Von and a gate-off voltage Voff.

The gray voltage generator 800 generates two sets of gray reference voltage sets in relation to transmittances of the pixels PX. The two sets of the gray reference voltages are then respectively and independently applied to the two sub-pixels with one of the two sets having a positive value with respect to the common voltage, Vcom, and the other having a negative value with respect to the common voltage, Vcom. However, the gray voltage generator 800 may also generate one gray reference voltage as a substitution for the two sets of gray reference voltages.

The data driver 500 is connected to the data lines D1 to Dm of the liquid crystal panel assembly 300, divides the gray reference gray voltages to generate gray voltages corresponding to all gray levels, and selects a data voltage from the generated gray voltages.

The signal controller 600 controls the gate driver 400 and the data driver 500.

Each of the driving elements 400, 500, 600 and 800 may be directly mounted on the liquid crystal panel assembly 300 as at least one integrated circuit ("IC") chip. In other exemplary embodiments, the driving elements 400, 500, 600 and 800 may be mounted on a flexible printed circuit film (not shown) and then on the liquid crystal panel assembly 300 in the form of a tape carrier package ("TCP"). In still another exemplary embodiment, the driving elements 400, 500, 600 and 800 may be mounted on a separate printed circuit board (not shown). Alternatively, the driving elements 400, 500, 600 and 800 may be integrated with the liquid crystal panel assembly 300 together with, for example, the signal lines $G_{1a}$-$G_{nb}$ and $D_1$-$D_m$ and the thin film transistor switching elements Qa and Qb. Moreover, the drivers 400, 500, 600 and 800 may be integrated into a single chip. In this case, at least one of the drivers 400, 500, 600 and 800 or at least one circuit forming the drivers 400, 500, 600 and 800 may be arranged outside the single chip.

An example of a liquid crystal panel assembly according to an exemplary embodiment of the present invention will now be described in detail with reference to FIG. 3.

Figure 3:
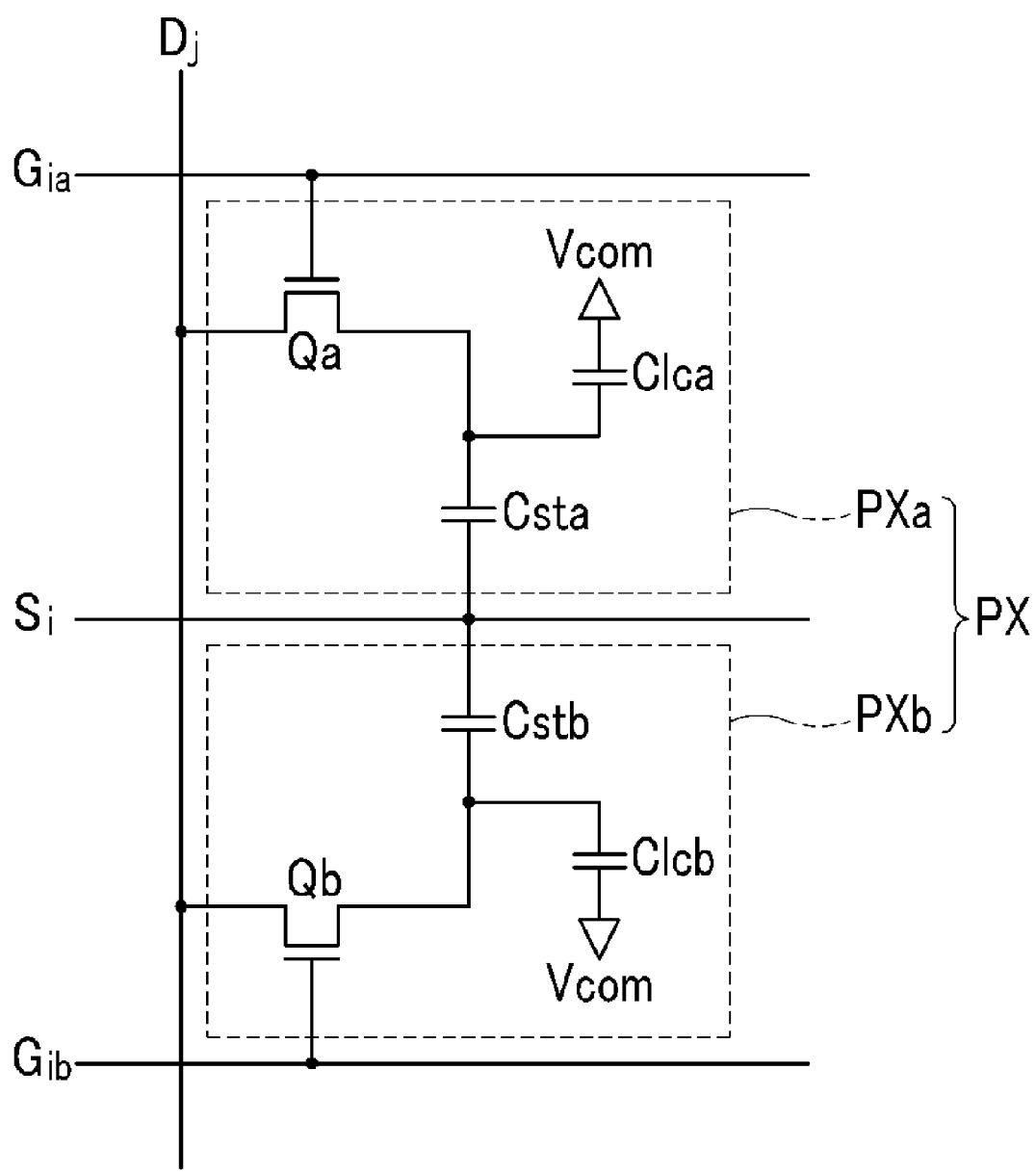
FIG. 3 is a circuit diagram of one pixel in a liquid crystal panel assembly according to an exemplary embodiment of the present invention.

FIG. 3 is an equivalent circuit diagram of one pixel in a liquid crystal panel assembly according to an exemplary embodiment of the present invention With reference to FIG. 3, it is noted that the liquid crystal panel assembly 300 may include signal lines including a plurality of pairs of gate lines $G_{ia}$ and $G_{ib}$, a plurality of data lines $D_j$, a plurality of storage electrode lines $S_j$, and a plurality of pixels PX that are connected to the signal lines. As shown in the example of FIG. 3, the pixel PX that is connected to the i-th pair of gate lines $G_{ia}$ and $G_{ib}$, the j-th data line $D_j$, and i-th storage electrode line $S_j$ is shown, and the gate line that is disposed on the upper side of the example is denoted by $G_{ia}$ (hereinafter referred to as "upper gate line") and the gate line that is disposed on the lower side of the example is donated by $G_{ib}$ (hereinafter referred to as "lower gate line").

Each of the pixels PX includes a pair of sub-pixels PXa and PXb. Each sub-pixel PXa or PXb respectively includes a corresponding switching element Qa or Qb. The switching element Qa or Qb is connected to a corresponding gate line $G_{ia}$ or $G_{ib}$ and a corresponding data line $D_j$. A liquid crystal capacitor Clca or Clcb and a storage capacitor Csta or Cstb are each connected to the switching element Qa or Qb and a corresponding storage electrode line $S_i$.

The switching element Qa or Qb comprises a three terminal element, such as a thin film transistor, which is provided in the lower panel 100. A control terminal of the switching element Qa or Qb is connected to the gate line $G_{ia}$ or $G_{ib}$. An input terminal of the switching element Qa or Qb is connected to the data line $D_j$. An output terminal of the switching element Qa or Qb is connected to the liquid crystal capacitor Clca or Clcb and the storage capacitor Csta or Cstb.

The storage capacitor Csta or Cstb, which assists the liquid crystal capacitor Clca or Clcb, is formed by an overlapping of the storage electrode line $S_i$, which is provided in the lower panel 100, and the pixel electrode PE with an insulator interposed therebetween. A predetermined voltage, such as the common voltage, Vcom, is then applied to the storage electrode line $S_i$. Alternatively, the storage capacitor Csta or Cstb may be formed by an overlapping of the sub-pixel electrode PEa or PEb and the previous gate line with an insulator interposed therebetween.

The liquid crystal capacitor Clca or Clcb has been described above. Thus, a detailed description thereof will be omitted.

In a liquid crystal display having a liquid crystal panel assembly 300 as described above, the signal controller 600 may receive inputted image signals R, G and B for each of the pixels PX. The signal controller then may convert the inputted input signals into output image signals DAT for the two sub-pixels PXa and PXb, and may transmit the output image signals DAT to the data driver 500. In contrast, the gray voltage generator 800 may generate different gray voltage sets for the two sub-pixels PXa and PXb and alternately supply the gray voltage sets to the data driver 500. Further, the data driver 500 may alternately select the gray voltage sets from the gray voltage generator 800. Accordingly, different voltages may be applied to the two sub-pixels PXa and PXb.

Here, in an embodiment of the invention, it may be necessary to correct an image signal or to generate gray voltage sets such that a synthesized gamma curve of the two sub-pixels PXa and PXb approximates a reference gamma curve at the front surface of the liquid crystal display panel assembly 300. For example, a synthesized gamma curve at the front surface approximates a reference gamma curve on the front side that is determined to be most suitable for the liquid crystal panel assembly 300, and a synthesized gamma curve at a side surface approximates the reference gamma curve at the front surface.

The operation of the liquid crystal display will now be described in detail.

The signal controller 600 receives inputted image signals R, G and B and inputted control signals, such as a vertical synchronization signal Vsync, a horizontal synchronizing signal Hsync, a main clock signal MCLK, and a data enabling signal DE which allows for a controlling of a display from an external graphics controller (not shown). The signal controller 600 appropriately processes the inputted image signals R, G and B based on the inputted control signals and in accordance with the operational conditions of the liquid crystal panel assembly 300. The signal controller further generates a gate control signal CONT1 and a data control signal CONT2 and transmits the gate control signal CONT1 to the gate driver 400 and the data control signal CONT2 along with the processed image signal DAT to the data driver 500.

The gate control signal CONT1 includes a scanning start signal which includes an instruction for the gate driver 400 to start a scanning operation, and at least one clock signal. The at least one clock signal may control an output cycle of the gate-on voltage Von.

The data control signal CONT2 includes a horizontal synchronization start signal STH which provides a signal to he data driver 500 that informs the data driver 500 of the start of a transmission of the digital image signals DAT to one row of pixels PX. The data control signal CONT2 also includes a load signal which provides an instruction to the data driver 500 to apply analog data voltages to the data lines $D_1$ to $D_m$, and a data clock signal HCLK. The data control signal CONT2 may further include an inversion signal which inverts the voltage polarity of the analog data voltage with respect to the common voltage Vcom (hereinafter, "the polarity of the data voltage with respect to the common voltage" is simply referred to as "the polarity of the data voltage").

The data driver 500 receives the digital image signals DAT for a group of sub-pixels PXa and PXb according to the data control signal CONT2 from the signal controller 600, and selects the gray voltages in correspondence with the digital image signals DAT. At this point, the data driver 500 converts the digital image signals DAT into analog data voltages which are then applied to the data lines $D_1$ to $D_m$.

The gate driver 400 applies the gate-on voltage Von to the gate lines $G_{1a}$ to $G_{nb}$ according to the gate control signal CONT1 from the signal controller 600 and turns the switching elements Qa and Qb, which are respectively connected to the gate lines $G_{1a}$ to $G_{nb}$, on. Then, the data voltages applied to the data lines $D_1$ to $D_m$ are applied to the sub-pixels PXa and PXb through the turned-on switching elements Qa and Qb.

A difference between the data voltage applied to the sub-pixels PXa and PXb and the common voltage Vcom is understood as approximating a charging voltage (e.g., a pixel voltage) of the liquid crystal capacitor Clc. Here, the arrangement of liquid crystal molecules varies according to the magnitude of the pixel voltage, such that the polarization of light passing through the liquid crystal layer 3 changes along with the magnitude of the pixel voltage. The change of the polarization of the light passing through the liquid crystal layer 3 causes a change in a transmittance of the light by the polarizer that is attached to the liquid crystal panel assembly 300.

The data driver 500 and the gate driver 400 repeat the same or similar operations for every one horizontal period, which may be referred to as "1H," and which is equal to one cycle of the horizontal synchronizing signal Hsync. In this manner, the gate-on voltage Von is sequentially applied to all the gate lines $G_{1a}$ to $G_{nb}$ and the data voltages are applied to all the pixels PX. When the next frame starts after one frame is completed, the state of the inversion signal, which is applied to the data driver 500, is controlled such that the polarity of the data voltage, which is applied to each pixel PX, is inverted with respect to the polarity of the previous frame (hereinafter referred to as "frame inversion"). At this time, in one frame, the polarity of the data voltage that flows in a data line may be inverted (for example, in row inversion and dot inversion operations) or the polarities of the data voltages that are applied to a row of pixels may vary (for example, in column inversion and dot inversion operations), according to relevant characteristics of the inversion signal.

Now, a gate driver according to an exemplary embodiment of the present invention will be described in detail with reference to FIG. 4 to FIG. 6.

Figure 4:
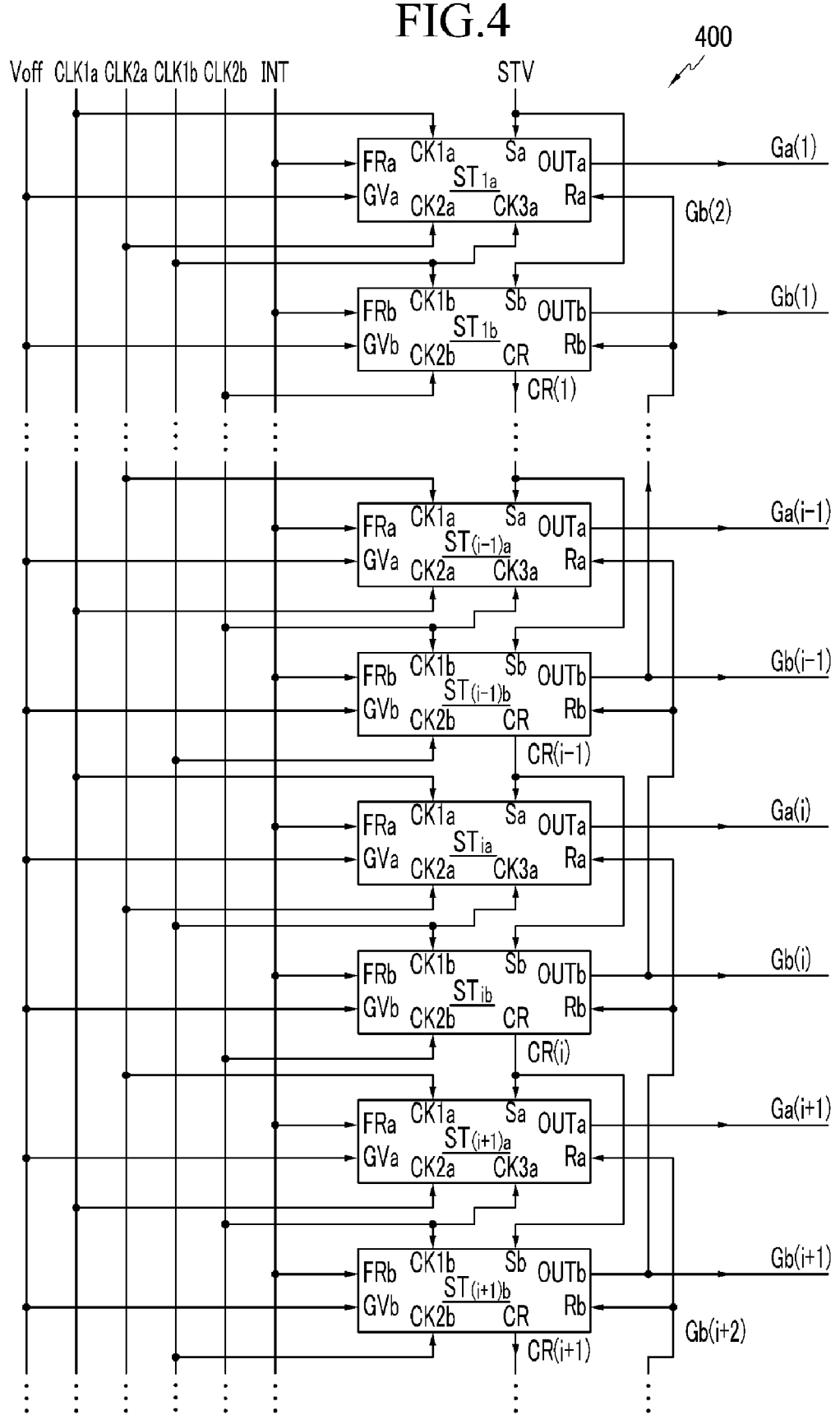
FIG. 4 is a block diagram of the gate driver shown in the exemplary embodiment of FIG. 1.
Figure 5:
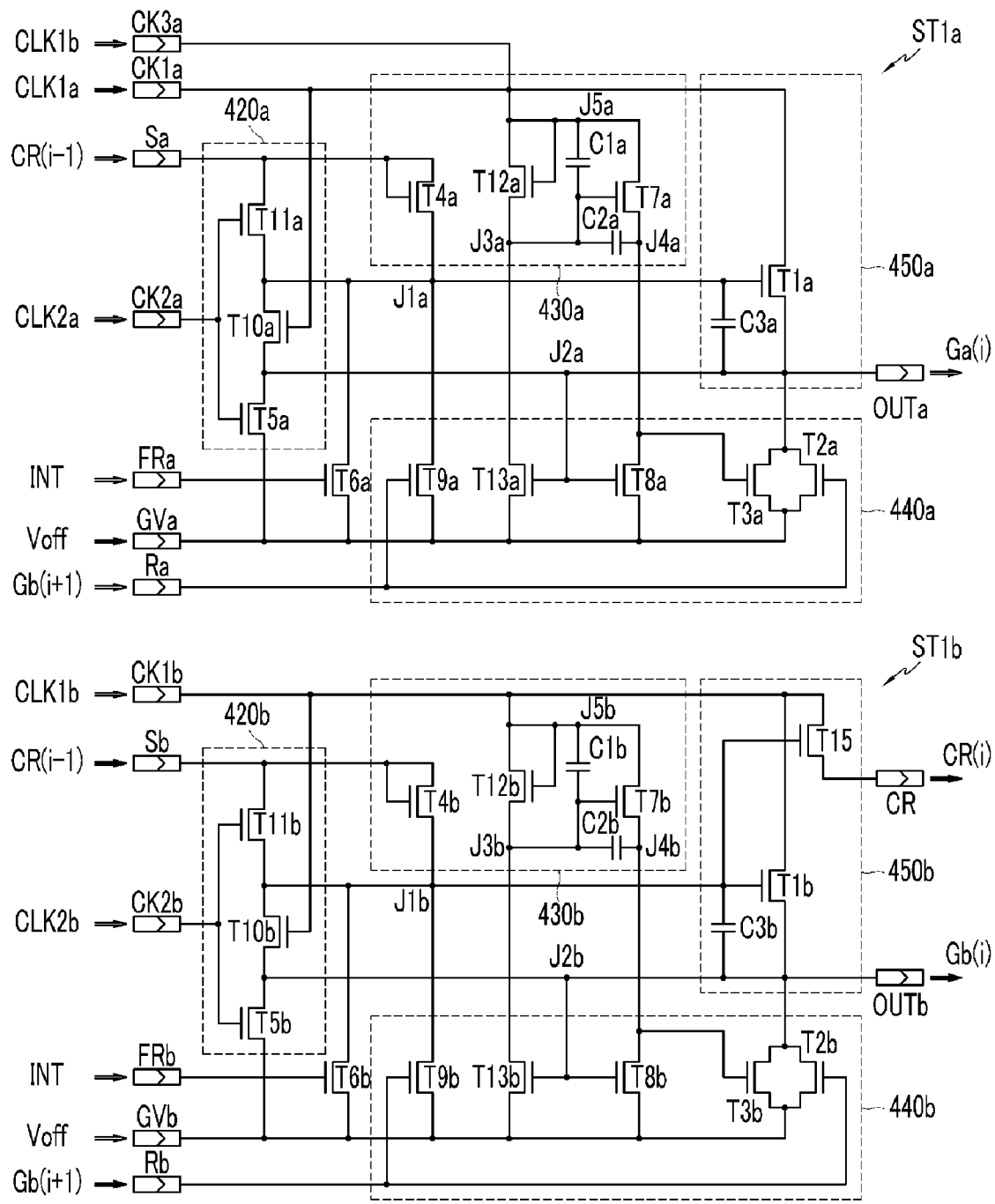
FIG. 5 is a circuit diagram of a pair of stages in the gate driver according to an exemplary embodiment of the present invention.
Figure 6:
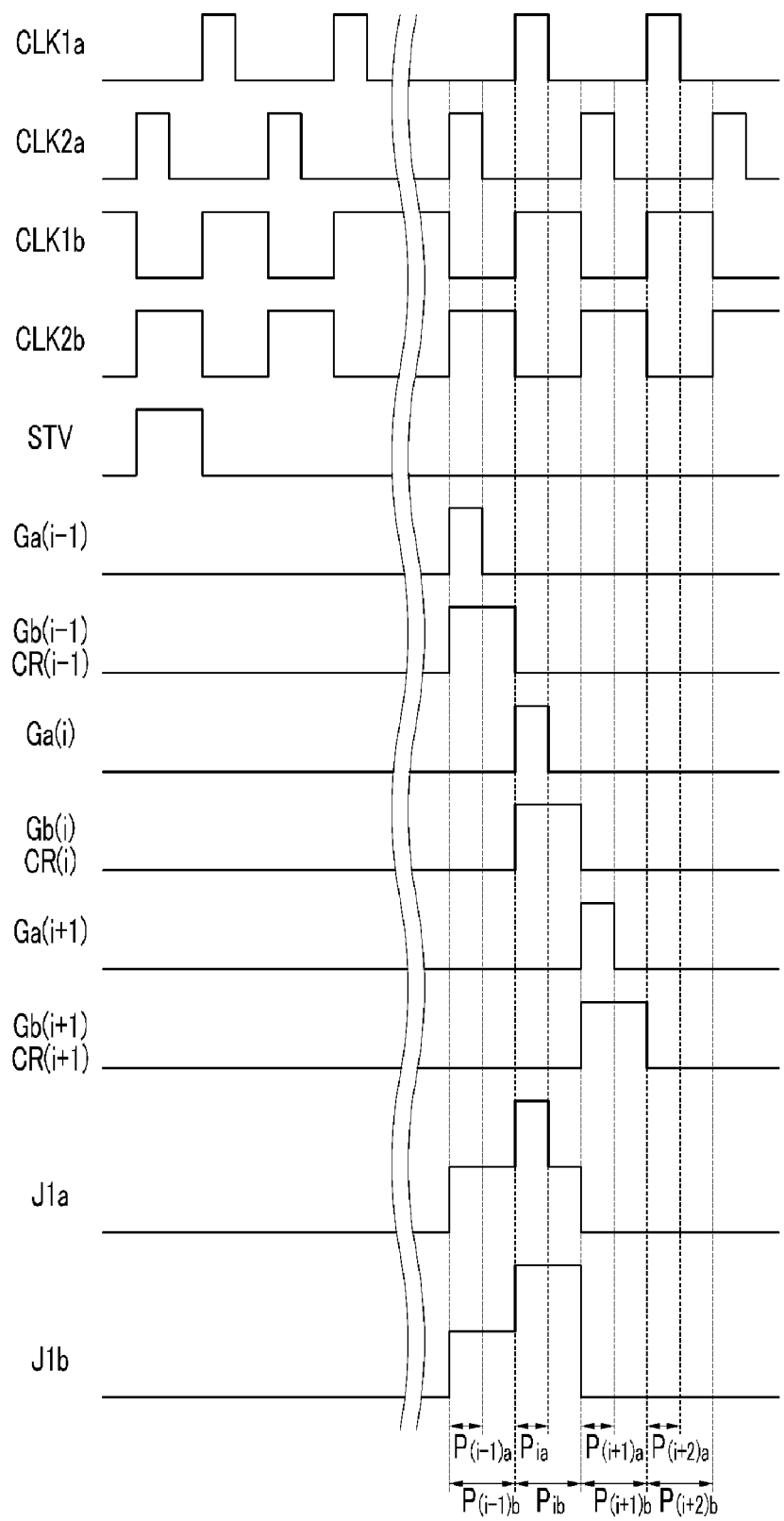
FIG. 6 is a signal timing chart of the gate driver shown in the exemplary embodiment of FIG. 4.

FIG. 4 is a block diagram of the gate driver shown in FIG. 1, FIG. 5 is a circuit diagram of a pair of stages in the gate driver according to an exemplary embodiment of the present invention, and FIG. 6 is a signal timing chart of the gate driver shown in FIG. 4.

Referring to FIG. 4 and FIG. 5, the gate driver 400 includes a plurality of upper stages $ST_{1a}$-$ST_{na}$. The upper stages $ST_{1a}$-$ST_{na}$ provide for a sequential output of gate signals to upper gate lines $G_{1a}$ to $G_{na}$. The gate driver 400 further includes a plurality of lower stages $ST_{1b}$-$ST_{nb}$. The lower stages $ST_{1b}$-$ST_{nb}$ provide for a sequential output of gate signals to lower gate lines $G_{1b}$-$G_{nb}$, with each receiving a gate-off voltage Voff, first to fourth clock signals CLK1a, CLK2a, CLK1b, and CLK2b, and a scanning start signal STV. The upper stages $ST_{1a}$-$ST_{na}$ are connected to the upper gate lines $G_{1a}$-$G_{na}$ on a one-on-one basis, and the lower stages $ST_{1b}$-$ST_{nb}$ are connected to the lower gate lines $G_{1b}$-$G_{nb}$ on a one-on-one basis.

Each of the upper stages $ST_{1a}$-$ST_{na}$ includes first to third clock terminals CK1a, CK2a, and CK3a, a set terminal Sa, a reset terminal Ra, a gate voltage terminal GVa, a frame reset terminal FRa, and a gate output terminal OUTa. Meanwhile, each of the lower stages $ST_{1a}$-$ST_{nb}$ includes first and second clock terminals CK1b and CK2b, a set terminal Sb, a reset terminal Rb, a gate voltage terminal GVb, a frame reset terminal FRb, a gate output terminal OUTb, and a carry output terminal CR.

In each upper stage, for example an i-th upper stage $ST_{ia}$, the first and second clock terminals CK1a and CK2a are applied along with the first and second clock signals CLK1a and CLK2a, the third clock terminal CK3a is applied along with the third or the fourth clock signal CLK1b or CLK2b, and the gate output terminal OUTa outputs a gate signal Ga(i) having the gate-on voltage during a shorter time than the time defined by 1H. In each lower stage, for example an i-th lower stage $ST_{ib}$, the first and second clock terminals CK1b and CK2b are applied along with the third and fourth clock signals CLK1b and CLK2b, the gate output terminal OUTb outputs gate signal Gb(i) having the gate-on voltage during the time period defined by 1H, and the carry output terminal CR outputs a carry signal CR(i) having the same voltage as the gate signal Gb(i). Further, the set terminals Sa and Sb of the i-th upper and lower stages $ST_{ia}$ and $ST_{ib}$ are applied along with the carry signal of the previous lower stage $ST_{(i-1)b}$, which is the previous carry signal CR(i-1), the reset terminals Ra and Rb are applied along with the gate signal of the next lower stage $ST_{(i+1)b}$, which is the next lower gate signal Gb(i+1), the gate voltage terminals GVa and GVb are applied along with the gate-off voltage Voff, and the frame reset terminals FRa and FRb are applied along with the initial signal INI.

The set terminals Sa and Sb of the first upper and lower stages $ST_{1a}$ and $ST_{1b}$, however, are applied along with the scanning start signal STV from the signal controller 600 as a result of a substitution for the previous carry signal. The reset terminals Ra and Rb of the last upper and lower stages $ST_{na}$ and $ST_{nb}$ are applied along with the signal having the gate-on voltage during 1H immediately after the gate signal Gb(n) of the lower stage $ST_{nb}$, and the signal may be provided from the signal controller 600. Also, the lower stage $ST_{(n+1)b}$ may be added to the next terminal of the last lower stage $ST_{nb}$ to provide for an outputting of this signal as the gate signal. In addition, when the first clock terminal CK1a of the i-th upper stage $ST_{ia}$ receives the first clock signal CLK1a, the second clock terminal CK2a receives the second clock signal CLK2a, and the third clock terminal CK3a receives the third clock signal CLK1b, the first clock terminals CK1a of the (i-1)-th and (i+1)-th upper stages $ST_{(i-1)a}$ and $ST_{(i+1)a}$ receive the second clock signal CLK2a, the second clock terminals CK2a receive the first clock signal CLK1a, and the third clock terminals CK3a receive the fourth clock signal CLK2b. When the first clock terminal CK1b of the i-th lower stage $ST_{ib}$ receives the third clock signal CLK1b and the second clock terminal CK2b receives the fourth clock signal CLK2b, the first clock terminals CK1b of the (i-1)-th and the (i+1)-th upper lower stage $ST_{(i-1)b}$ and $ST_{(i+1)b}$ receive the fourth clock signal CLK2b, and the second clock terminals CK2b receive the third clock signal CLK1b.

Here, in embodiments of the invention, the high level of the first to fourth clock signals CLK1a, CLK2a, CLK1b, and CLK2b may be the same as or substantially similar to the gate-on voltage Von so as to drive the switching elements of the pixels PX. The third and fourth clock signals CLK1b and CLK2b may have a duty ratio of 50%, a cycle of 2 H, and a phase difference of 180° between each other. The first and second clock signals CLK1a and CLK2a may have a duty ratio of less than 50%, a cycle of 2 H, and a phase difference of 180° between each other.

With reference now to FIG. 5, it is noted that each of the upper/lower stages, for example the i-th upper/lower stage $ST_{ia}/ST_{ib}$ of the gate driver 400 includes an input section 420a/420b, a pull-up driver 430a/430b, a pull-down driver 440a/440b, and an output section 450a/450b. They each further include at least one of n-type metal-oxide-semiconductor (NMOS) transistors T1a to T13a, T1b to T13b and T15, respectively. The pull-up driver 430a/430b and the output section 450a/450b further include capacitors C1a/C1b to C3a/C3b. However, in embodiments of the invention, a p-type metal-oxide-semiconductor (PMOS) transistor may be used in place of the NMOS transistor. In addition, the capacitors C1a/C1b to C3a/C3b may comprise parasitic capacitances formed between drain and source electrodes during known and/or practical manufacturing processes.

The input section 420a/420b include three transistors T11a/T11b, T10a/T10b, and T5a/T5b that are sequentially connected in series to the set terminal Sa/Sb and the gate voltage terminal GVa/GVb. Gates of the transistors T11a/T11b and T5a/T5b are respectively connected to the second clock terminal CK2a/CK2b, and a gate of the transistor T5a/T5b is connected to the first clock terminal CK1a/CK1b. A junction point between the transistor T11a/T11b and the transistor T10a/T10b is connected a junction point J1a/J1b. Similarly, a junction point between the transistor T10a/T10b and the transistor T5a/T5b is connected to a junction point J2a/J2b.

The pull-up driver 430a/430b includes a set of transistors. The transistors include the transistor T4a/T4b, which is connected between the set terminal Sa/Sb and the junction point J1a/J1b, the transistor T12a/T12b, which is connected between the clock terminal CK3a/CK1b and a junction point J3a/J3b, and the transistor T7a/T7b, which is connected between the clock terminal CK3a/CK1b and a junction point J4a/J4b. Here, while the transistors T7b and T12b are respectively connected to the first clock terminal CK1b, the transistors T7a and T12a are respectively connected to the third clock terminal CK1a so as to receive the same clock signal as that of the first clock terminal CK1b. On the other hand, a gate and a drain of the transistor T4a/T4b are commonly connected to the set terminal Sa/Sb while a source of the set terminal Sa/Sb is connected to the junction point J1a/J1b, and a gate and a drain of the transistor T12a/T12b is commonly connected to the clock terminal CK3a/CK1b while a source of the transistor T12a/T12b is connected to the junction point J3a/J3b. A gate of the transistor T7a/T7b is connected to the junction point J3a/J3b and is simultaneously connected to the clock terminal CK3a/CK1b through the capacitor C1a/C1b. A drain thereof is connected to the clock terminal CK3a/CK1b and a source thereof is connected to the junction point J4a/J4b, while the capacitor C2a/C2b is connected between the junction point J3a/J3b and the junction point J4a/J4b.

The pull-down driver 440a/440b includes a plurality of transistors T9a/T9b, T13a/T13b, T8a/T8b, T3a/T3b, T2a/T2b, and T6a/T6b that receive the gate-off voltage Voff through their respective sources and provide their respective outputs to the junction points J1a/J1b, J2a/J2b, J3a/J3b, and J4a/J4b through their respective drains. That is, a gate and the drain of the transistor T9a/T9b is connected to the reset terminal Ra/Rb and the junction point J1a/J1b, and gates of the transistors T13a/T13b and T8a/T8b are commonly connected to the junction point J2a/J2b while their drains are respectively connected to the junction points J3a/J3b and J4a/J4b. A gate of the transistors T3a/T3b is connected to the junction point J4a/J4b, a gate of the transistors T2a/T2b is connected to the reset terminal Ra/Rb, and the drains of two transistors T2a/T2b and T3a/T3b are connected to the junction point J2a/J2b. A gate of the transistor T6a/T6b is connected to the frame reset terminal FRa/FRb, its drain is connected to the junction point J1a/J1b, and its source is connected to the gate-off voltage terminal GVa/GVb.

The output section 450a/450b includes the transistor T1a/T1b and the capacitor C3a/C3b. A drain and a source of the transistor T1a/T1b are respectively connected to the first clock terminal CK1a/CK1b and the output terminal OUTa/OUTb while a gate of the transistor T1a/T1b is connected to the junction point J1a/J1b. The capacitor C3a/C3b is connected between the gate and the source of the transistor T1a/T1b. The source of the transistors T1a/T1b is also connected to the junction point J2a/J2b. On the other hand, the output section 450b of the lower stage $ST_{ib}$ further includes the transistor T15. A drain and a source of the transistor T15 are respectively connected between the first clock terminal CK1b and the carry terminal CR. A gate is connected to the junction point J1b. Here, a capacitor may be connected between the gate and the drain of the transistor T15.

At this point, the operation of the gate driver in accordance with an exemplary embodiment of the present invention will be described in detail with reference to FIG. 6.

For better comprehension and ease of description, a voltage corresponding to a high level of each of the first to fourth clock signals CLK1a, CLK2a, CLK1b, and CLK2b is assumed to be the same as or substantially similar to the gate-on voltage Von and is referred to as "a high voltage," while a voltage corresponding to a low level of each of the first to fourth clock signals CLK1a, CLK2a, CLK1b, and CLK2b is assumed to be the same as or substantially similar to the gate-off voltage Voff and is referred to as "a low voltage." As such, it is determined that the duty ratio of each of the first and second clock signals CLK1a and CLK2a is 25%, that the gate-on voltage Von of the gate signal applied to the i-th gate line $G_{ia}$ is generated during a period $P_{ia}$, and that the gate-on voltage Von of the gate signal is applied to the i-th gate line $G_{ib}$ during periods $P_{ia}$ and $P_{ib}$.

Also, as above-described, in the gate driver 400 as described above and in accordance with an exemplary embodiment of the present invention, the set terminal Sa/Sb of the i-th upper/lower stage $ST_{ia}/ST_{ib}$ receives the previous carry signal CR(i−1), and the set terminal Sa/Sb of the first upper/lower stage $ST_{ia}/ST_{ib}$ receives the scanning start signal STV. Here, because the scanning start signal STV has the high voltage applied thereto during the 1H period just before the periods $P_{ia}$ and $P_{ib}$, which are the operational periods of the first upper/lower stage $ST_{ia}/ST_{ib}$, for a case in which the previous carry signal CR(i−1) has the high voltage during the periods $P_{(i-1)a}$ and $P_{(i-1)b}$, the operation of the i-th upper/lower stage $ST_{ia}/ST_{ib}$ will be described below.

During the period $P_{(i-1)a}$, when the previous carry signal CR(i−1) and the clock signal CLK2a/CLK2b is the high voltage, the transistors T11a/T11b and T5a/T5b and the transistors T4a/T4b are turned on. Thereby, two transistors T11a/T11b and T4a/T4b transmit the high voltage to the junction points J1a/J1b, and the transistors T5a/T5b transmit the low voltage to the junction points J2a/J2b. In accordance with this arrangement, the transistors T1a/T1b and T15 are turned on. Further, as a result, the clock signal CLK1a is output to the output terminal OUTa, the clock signal CLK1b is output to the output terminal OUTb and the carry output terminal CR outputs. Moreover, due to the fact that the clock signal CLK1a/CLK1b has the low voltage, the upper/lower gate signal Ga(i)/Gb(i) and the carry signal CR(i) also have the low voltage. Simultaneously, the capacitor C3a/C3b stores the voltage corresponding to the difference between the high voltage and the low voltage, e.g., the high voltage of the previous carry signal CR(i−1). Also, a voltage level of the junction point J2a/J2b approximates the low voltage provided by the transistor T5a/T5b such that a ripple effect may be prevented when the voltage of the output terminal OUTa/OUTb is changed to the low voltage.

Here, because the clock signal CLK1a/CLK1b is provided at the low voltage, the next lower gate signal Gb(i+1) is provided at the low voltage, and because the junction point J2a/J2b are provided at the low voltage, the transistors T10a/T10b, T12a/T12b, T2a/T2b, T9a/T9b, T13a/T13b, and T8a/T8b, to which the gates are connected, are maintained in an off state.

Next, during the period $P_{(i-1)b}$, when the clock signal CLK2a is set to approximate the low voltage with the clock signal CLK2b approximating the high voltage, the transistors T11a and T5a are turned off. However, because the transistor T1a/T1b is in the on state, the upper/lower gate signal Ga(i)/Gb(i) and the carry signal CR(i) are each maintained at the low voltage. Also, the capacitor C3a/C3b stores the previous carry signal CR(i−1) of the high voltage.

Next, during the period $P_{ia}$, when the clock signal CLK2b and the previous carry signal CR(i−1) are set at the low voltage with the transistors T11a and T5a turned off, the transistors T11b, T5b, and T4a/T4b are also turned off. Simultaneously, when the clock signals CLK1a and CLK1b are set at the high voltage, the source voltage of the transistor T1a/T1b and the voltage of the junction point J2a/J2b are set at the high voltage. Here, the gate of the transistor T10a/T10b is applied along with the high voltage, but because the potential of the source, which is connected to the junction point J2a/J2b is the same as or substantially similar to the high voltage, the transistor T10a/T10b are maintained in the off state. Accordingly, the junction point J1a/J1b is floated and a potential of the junction point J1a/J1b is increased by the high voltage by the capacitor C3a/C3b, and the transistors T1a/T1b and T15 are maintained in the on state.

On the other hand, because the potentials of the clock signal CLK1a/CLK1b and the junction point J2a/J2b are set at the high voltage, the transistors T12a/T12b, T13a/T13b, and T8a/T8b are turned on. Here, the transistor T12a/T12b and the transistor T13a/T13b are connected to each other in series between the high voltage and the low voltage, such that the potential of the junction point J3a/J3b has a voltage, which is divided by the on-resistance of the transistors T12a/T12b and T13a/T13b. However, if the on-resistance of the transistor T13a/T13b is predetermined to be very large as compared with the on-resistance of transistor T12a/T12b, the voltage of the junction point J3a/J3b is set to be almost the same as or substantially similar to the high voltage. Accordingly, the transistor T7a/T7b is turned on and connected in series to the transistor T8a/T8b, such that the potential of the junction point J4a/J4b has a voltage, which is divided by the on-resistance of two transistors T7a/T7b and T8a/T8b. Here, if the on-resistances of two transistors T7a/T7b and T8a/T8b are predetermined to be almost the same or substantially similar, the potential of the junction point J4a/J4b is set as nearly a middle value between the high voltage and the low voltage, such that the transistor T3a/T3b is maintained in the off state. Further, because the next lower gate signal Gb(i+1) is set at the low voltage, the transistors T9a/T9b and T2a/T2b are also maintained in the off state. Accordingly, the output terminal OUTa is only connected to the clock signal CLKa, and the output terminal OUTb and the carry output terminal CR are only connected to the clock signal CLK1b. As a result, the output terminal OUTb and the carry output terminal CR are isolated from the low voltage and, therefore, output the high voltage. That is, the output terminal OUTa/OUTb may output the high voltage by the high voltages that are stored in the capacitor C3a/C3b by the previous carry signal CR(i−1) and the high voltage of the clock signal CLK1a/CLK1b during the periods $P_{(i-1)a}$ and $P_{(i-1)b}$.

The capacitor C1a/C1b and the capacitor C2a/C2b charge the voltage corresponding to the potential difference between both of the terminals, and the voltage of the junction point J3a/J3b is lower than the voltage of the junction point J5a/J5b.

Next, during the period $P_{ib}$, when the clock signal CLK1a is set at the low voltage with the clock signal CLK2a being set at the high voltage, the output terminal OUTa connected to the clock signal CLK1a outputs the upper gate signal Ga(i) of the low voltage. Also, the transistors T13a and T8a are turned off by the junction point J2a of the low voltage. Here, the transistors T12a and T7a are maintained in the on state by the clock signal CLK1b, but the voltage of the junction point J2a is set at the low voltage by the output terminal OUT such that the transistors T8a and T13a are turned off. As a result, the voltage of the junction point J4a is set at the high voltage such that the transistor T3a is turned on, and the voltage of the output terminal OUTa is maintained as the low voltage. Here, the junction point J1a, which is set in a floating state, is decreased by the high voltage of the capacitor C1a while, on the other hand, the output terminal OUTb outputs the lower gate signal Gb(i) of the high voltage by the clock signal CLK1b of the high voltage.

Conversely, as in the explanation provided above regarding the periods $P_{ia}$ and $P_{ib}$, the (i+1)-th lower gate signal Gb(i+1) is set at the high voltage by the clock signal CLK2b of the high voltage and the i-th carry signal CR(i) of the high voltage in periods $P_{(i+1)a}$ and $P_{(i+1)b}$. Accordingly, during the period $P_{(i+1)a}$, the transistors T9a/T9b and T2a/T2b are turned on by the high voltage of the next lower gate signal Ga(i+1). In that state, the transistors T9a/T9b and T2a/T2b transmit the low voltage to the junction points J1a/J1b and J2a/J2b, and, when the clock signal CLK2a/CLK2b is set at the high voltage, the transistors T5a/5b and T11a/T11b are turned on so as to transmit the low voltage to the junction points J1a/J1b and J2a/J2b.

Here, the voltage of the junction point J1a/J1b is dropped down to the low voltage upon the discharge of the capacitor C3a/C3b, and time to completely drop the junction point J1a/J1b to the low voltage is needed due to the discharge time of the capacitor C3a/C3b. Accordingly, two transistors T1a/T1b and T15a/T15b are maintained in the on state such that the output terminal OUTa/OUTb and the carry output terminal CR are connected to the clock signal CLK1a/CLK1b to output the low voltage. Next, when the capacitor C3a/C3b is completely discharged such that the potential of the junction point J1a/J1b is set at the low voltage, the transistor T15 is turned off. As a result, the carry output terminal CR is blocked by the clock signal CLK1b, and the carry signal CR(i) is floated and is maintained at the low voltage. Simultaneously, since the output terminal OUTa/OUTb is connected to the low voltage through the transistor T2a/T2b, the output terminal OUTa/OUTb continuously outputs the low voltage even though the transistor T1a/T1b is turned off.

On the other hand, since the transistors T12a/T12b and T13a/T13b are turned off by the low voltage of the clock signal CLK1b, the junction point J3a/J3b becomes a floating state. Also, the voltage of the junction point J5a/J5b is set to be lower than the voltage of the junction points J4a/J4b, and since the voltage of the junction point J3a/J3b is maintained in a state of being at a lower voltage than the voltage of the junction point J5a/J5b by the capacitor C1a/C1b, the transistor T7a/T7b is turned off. Simultaneously, because the transistor T8a/T8b is also turned off, the voltage of the junction point J4a/J4b is decreased to an extent that the transistor T3a/T3b is also turned off. Further, because the gate of the transistor T10a/T10b is connected to the clock signal CLK1a/CLK1b of the low voltage and the voltage of the junction point J2a/J2b is the low voltage, the off state is maintained.

Next, during the period $P_{(i+1)b}$, when the clock signal CLK2a is set at the low voltage with the clock signal CLK2b being set at the high voltage, the transistors T11a and T5a are turned off. However, because the transistors T2a/T2b and T9a/T9b are maintained in the on state, the upper/lower gate signal Ga(i)/Gb(i) and the carry signal CR(i) are maintained at the low voltage. During the periods $P_{(i+2)a}$ and $P_{(i+2)b}$, when the clock signal CLK1b is set at the high voltage, the transistors T12a/T12b and T7a/T7b are turned on and the voltage of the junction point J4a/J4b is increased to thereby turn on the transistors T3a/T3b such that the low voltage is transmitted to the junction points J2a/J2b. Accordingly, the output terminal OUTa/OUTb continuously outputs the low voltage.

On the other hand, since the gate of the transistors T10a/T10b is connected to the clock signal CLK1a/CLK1b, which is set at the high voltage, and the voltage of the junction point J2a/J2b is set at the low voltage in the period $P_{(i+2)a}$, the transistors T10a/T10b are turned on to allow for a transmittal of the low voltage of the junction point J2a/J2b to the junction point J1a/J1b. Here, the drain of the transistor T1a/T1b is continuously applied along with the clock signal CLK1a/CLK1b and the transistor T1a/T1b is relatively large compared with the rest of the transistors, that is, since the parasitic capacitance generated between the gate and the drain of the transistor T1a/T1b, the voltage change of the drain may influence the gate voltage. Accordingly, when the clock signal CLK1a/CLK1b is set at the high voltage, the gate voltage is increased due to the parasitic capacitance between the gate and the drain such that the transistor T1a/T1b may be turned on. Therefore, the low voltage of the junction point J2a/J2b is transmitted to the junction point J1a/J1b such that the gate voltage of the transistor T1a/T1b is maintained at the low voltage. The transistor T1a/T1b thereby prevents the transistor T1a/T1b from being turned on.

Next, the voltage of the junction point J1a/J1b is maintained at the low voltage until the previous carry signal CR(i−1) is set at the high voltage, and when the clock signal CLK1b is set at the high voltage, the voltage of the junction point J2a/J2b is set at the low voltage through the transistor T3a/T3b, and the low voltage is maintained through the transistors T5a/T5b when the clock signal CLK1b is the low voltage.

On the other hand, the transistor T6a/T6b receives the initialized signal INT of the high voltage to transmit the gate-off voltage Voff to the junction point J1a/J1b such that the voltage of the junction point J1a/J1b is determined to be the low voltage once more. Here, in an embodiment of the invention, the initialized signal INT may be the signal that is set at the high voltage at least until the start of the next frame after the last lower gate signal Gb(n) is set at the high voltage.

In this way, after storing the high voltage of the previous carry signal CR(i−1), the upper and lower stages $ST_{ia}$ and $ST_{ib}$ output the gate signals Ga(i) and Gb(i) and the carry signal CR(i) set at the high voltage in synchronization with the high voltage of the clock signal of the first clock terminal CK1a/CK1b. In addition, the upper and lower stages $ST_{ia}$ and $ST_{ib}$ output the gate signal Ga(i) set at the low voltage in synchronization with the low voltage of the clock signal of the first clock terminal CK1a that is changed when the clock signal of the first clock terminal CK1b is set at the high voltage. Also, the upper and lower stages $ST_{ia}$ and $ST_{ib}$ discharge the stored high voltage in synchronization with the high voltage of the next lower gate signal Gb(i+1) and the high voltage of the clock signal of the second clock terminal CK2a/CK2b. In addition, the upper and lower stages $ST_{ia}$ and $ST_{ib}$ output the gate signals Ga(i) and Gb(i) and the carry signal CR(i) of the low voltage.

In this way, according to an exemplary embodiment of the present invention, although the timings of the gate-on voltage of the upper gate line and the gate-on voltage of the lower gate line are or may be different, the gate signal of the lower gate line may be used as the reset signal of the upper stage such that the gate driver may be obtained without the additional circuit to compensate for the timing.

Next, the gate driver according to another exemplary embodiment of the present invention will be described in detail with reference to FIG. 7 and FIG. 8.

Figure 7:
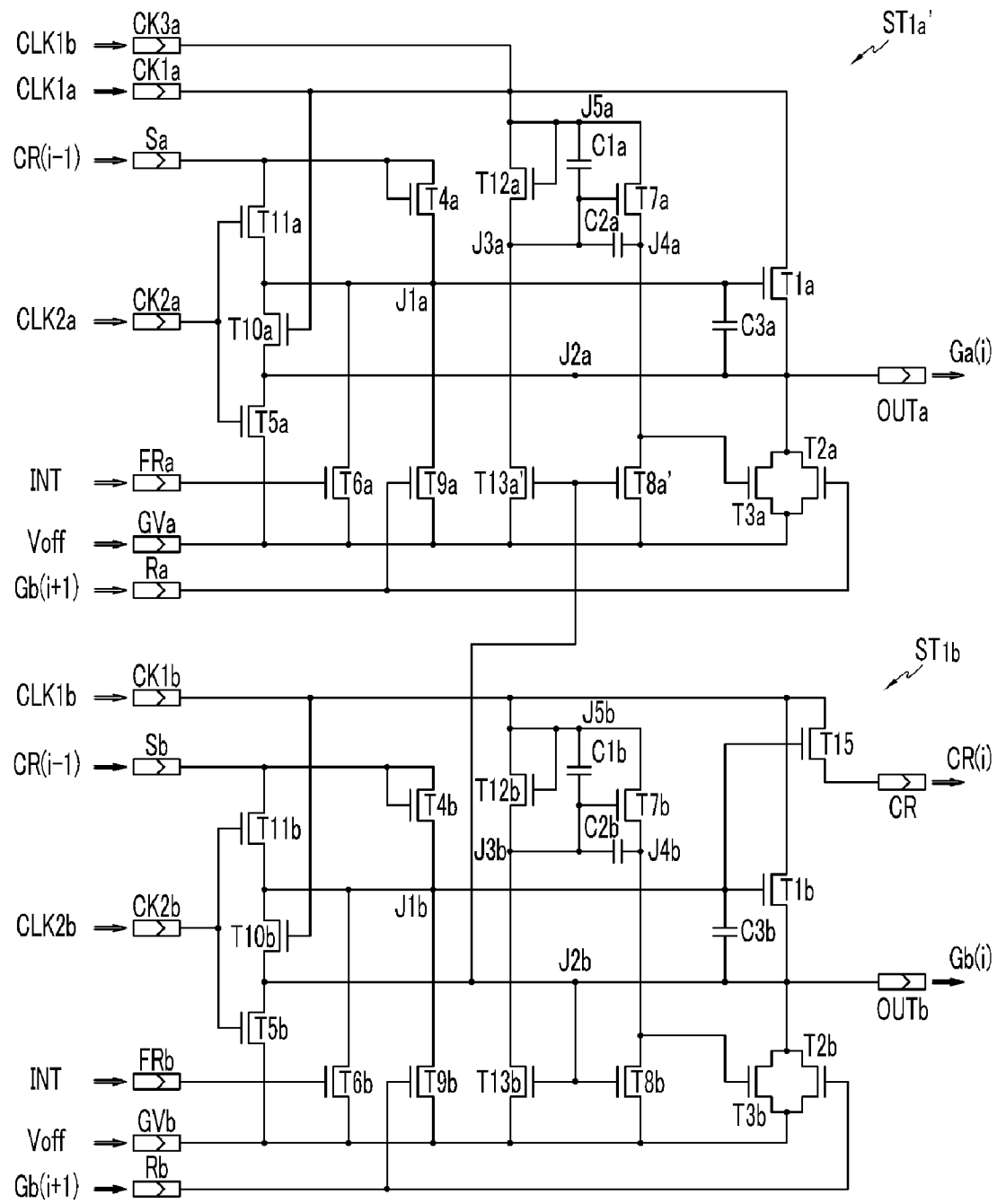
FIG. 7 and FIG. 8 are circuit diagrams of a pair of stages of gate drivers according to other exemplary embodiments of the present invention, respectively.
Figure 8:
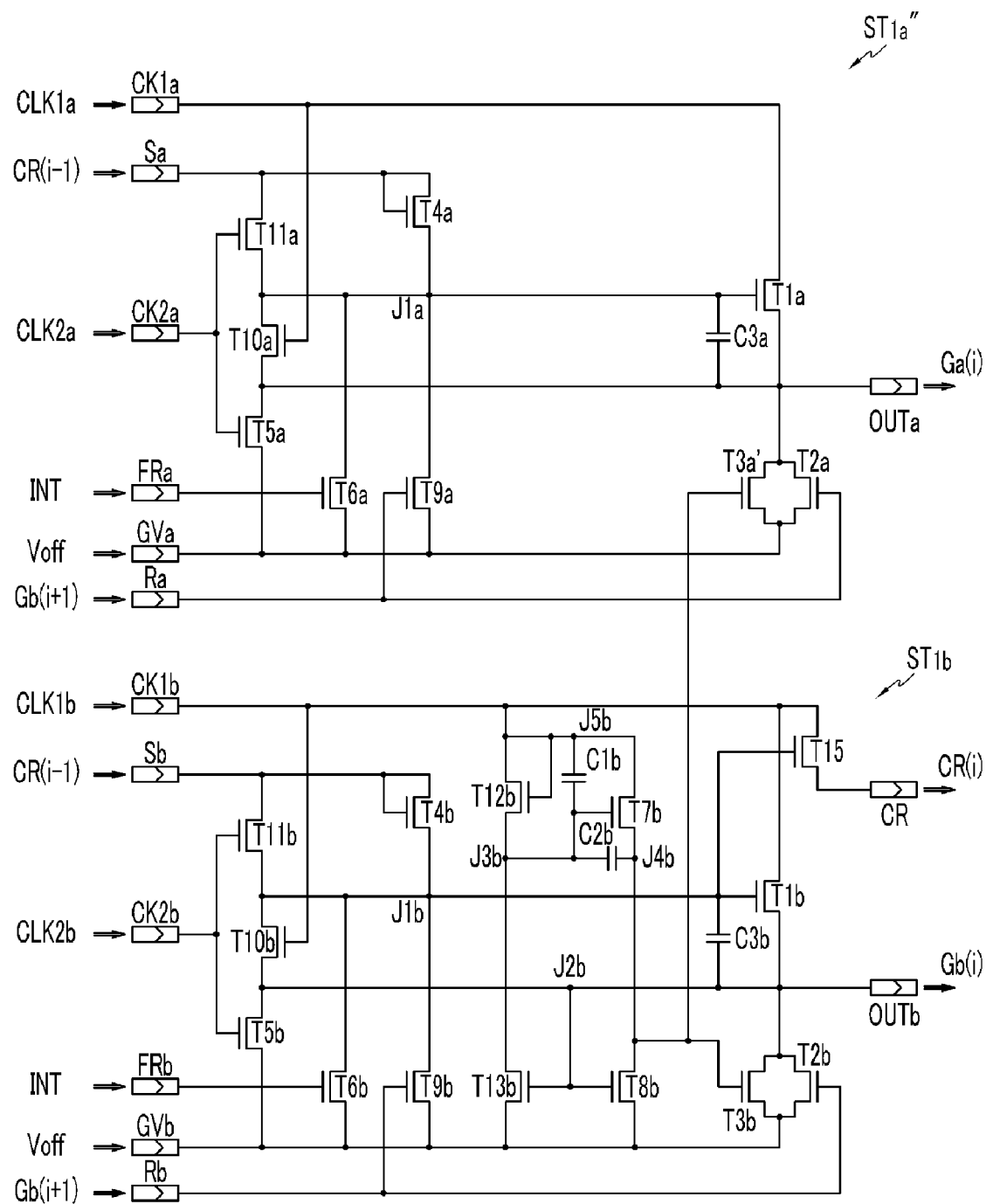

FIG. 7 and FIG. 8 are circuit diagrams of a pair of stages of the gate driver according to other exemplary embodiments of the present invention, respectively.

As is described above, the drain of the transistors T12a and T7a of the pull-up driver 430a in the upper stage $ST_{ia}$ is applied along with the same clock signal as the clock signal CLK1b/CLK2b transmitted to the drain of the transistors T12b and T7b of the pull-up driver 430b in the lower stage $ST_{ib}$. In additional, the gates of two transistors T13a/T13b and T8a/T8b of the pull-down driver 430a/430b are connected to the junction point J2a/J2b, and the two junction points J2a and J2b have the same or substantially similar voltages except for the period $P_{ib}$. Accordingly, the four transistors T12a, T7a, T13a, and T8a of the upper stage $ST_{ia}$ and the four transistors T12b, T7b, T13b, and T8b of the lower stage $ST_{ib}$ are operated in the same or a substantially similar manner except for the period $P_{ib}$.

On the other hand, because the transistor T3a is turned on so as to allow for a transmission of the low voltage to the output terminal OUTa and because the low voltage is simultaneously transmitted to the output terminal OUTa by the low voltage of the first clock terminal CK1a in the period $P_{ib}$, although the transistor T3a is maintained in the off state in the period of $P_{ib}$, the output terminal OUTa may be applied along with the low voltage.

Accordingly, the gate of the transistors T8a' and T13a' in the upper stage $ST_{ia}'$, shown in FIG. 7, is connected to the junction point J2b of the lower stage $ST_{ib}'$ in the substitution for the junction point J2a of the upper stage $ST_{ia}'$. Therefore, the transistor T3a' is maintained in the off state during the period $P_{ib}$, and, when the clock signal CLK1a is set at the low voltage, the output terminal OUTa that is connected to the clock signal CLK1a outputs the upper gate signal Ga(i) of the low voltage.

In addition, four transistors T12a, T7a, T13a, are T8a are removed in the upper stage $ST_{ia}''$ shown in FIG. 8, and the gate of the transistor T3a' is connected to the junction point J4b of the lower stage $ST_{ib}''$. Accordingly, four transistors and two capacitors may be eliminated for the upper stage $ST_{ia}''$. In this manner, the structure of the gate driver 400 may be simplified. This has the effect of thereby reducing the size of the gate driver 400. Furthermore, when the gate driver 400 is integrated in one substrate along with the gate lines, the data lines, and the thin film transistor switching elements in the liquid crystal panel assembly 300, the integrated area thereof may be reduced.

According to an exemplary embodiment of the present invention, although the timings of the gate-on voltages transmitted to the gate lines of two sub-pixels are different, the gate signal of the gate line of one sub-pixel is used to generate the gate signal of the other sub-pixel. In this manner, the gate driver 400 may be structured without an additional circuit which would otherwise be configured to compensate for the timing. Furthermore, the stage to generate the gate signal of the one sub-pixel and the stage to generate the gate signal of the other sub-pixel commonly use a portion of the circuits, thereby simplifying the structure of the gate driver.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a plurality of first gate lines;
   a plurality of second gate lines, each second gate line forming a pair along with each of the first gate lines; and
   a gate driver which sequentially transmits a first gate signal having a first gate-on voltage to the first gate lines, and sequentially transmits a second gate signal having a second gate-on voltage to the second gate lines,
   wherein the gate driver includes:
      a plurality of first stages, each first stage having a first output terminal which transmits the first gate signal to a corresponding first gate line from among each of the first gate lines, and
      a plurality of second stages, each second stage having a second output terminal which transmits the second gate signal to a corresponding second gate line from among each of the second gate lines, and a carry output terminal which outputs a carry signal in correspondence with the second gate signal, and
      wherein each first stage outputs the first gate-on voltage to the first output terminal based on a third gate-on voltage of the carry signal from a previous second stage, and
      each second stage outputs the second gate-on voltage to the second output terminal based on the third gate-on voltage of the carry signal from the previous second stage.

2. The display device of claim 1, wherein
   a period of the second gate signal having the second gate-on voltage and a period of the first gate signal having the first gate-on voltage are at least partially overlapped with each other.

3. The display device of claim 2, wherein
   the period of the second gate signal having the second gate-on voltage is longer than the period of the first gate signal having the first gate-on voltage.

4. The display device of claim 1, further comprising
   a signal controller which outputs first to fourth clock signals which alternately have a first voltage and a second voltage, respectively,
   wherein the first and second clock signals are respectively inputted to first and second clock terminals of one of two neighboring first stages of the plurality of first stages, and the second and first clock signals are respectively inputted to the first and second clock terminals of the other of the two neighboring first stages;
   the third and fourth clock signals are respectively inputted to third and fourth clock terminals of one of two neighboring second stages of the plurality of second stages, and the fourth and third clock signals are respectively inputted to the third and fourth clock terminals of the other of the two neighboring second stages;
   each first stage outputs the first gate-on voltage in synchronization with the first voltage of the first clock terminal; and
   each second stage outputs the second gate-on voltage in synchronization with the first voltage of the third clock terminal.

5. The display device of claim 4, wherein:
   cycles of the first to fourth clock signals are substantially similar with one another;
   a period having the first voltage of the first and second clock signals is smaller than a period of the second voltage, and a phase difference of the first and second clock signals is approximately 180 degrees; and
   a duty ratio of the third and fourth clock signals is approximately 50%, and a phase difference of the third and fourth clock signals is approximately 180 degrees.

6. The display device of claim 4, wherein
   the first voltage, the first gate-on voltage, and the second gate-on voltage are substantially similar with one another, and the second voltage is substantially similar to a gate-off voltage.

7. The display device of claim 4, wherein:
   each first stage stores the third gate-on voltage of the carry signal of the previous second stage, and outputs the first gate-on voltage based on the stored voltage in synchronization with the first voltage of the first clock terminal; and
   each second stage stores the third gate-on voltage of the carry signal of the previous second stage, and outputs the second gate-on voltage based on the stored voltage in synchronization with the first voltage of the third clock terminal.

8. The display device of claim 7, wherein
   each first stage outputs a gate-off voltage to the first output terminal in synchronization with the second voltage of the first clock terminal when the third clock terminal of the corresponding second stage is set at the first voltage.

9. The display device of claim 7, wherein:
   each first stage discharges the stored voltage in synchronization with the second gate-on voltage of the second gate signal of a next second stage, and outputs a first gate-off voltage to the first output terminal; and
   each second stage discharges the stored voltage in synchronization with the second gate-on voltage of the second gate signal of a next second stage, and outputs a second gate-off voltage to the second output terminal.

10. The display device of claim 9, wherein
    each first stage outputs the first gate-off voltage in synchronization with the first voltage of the second clock terminal, and
    each second stage outputs the second gate-off voltage in synchronization with the first voltage of the fourth clock terminal.

11. The display device of claim 4, wherein:
    each first stage includes a first transistor, which is connected between the first output terminal and a first gate-off voltage, and which turns on the first transistor in response to the first voltage of the third clock terminal unless a voltage of the first output terminal is the first gate-on voltage; and
    each second stage includes a second transistor, which is connected between the second output terminal and a second gate-off voltage, and which turns on the second transistor in response to the first voltage of the third clock terminal unless the voltage of the second output terminal is the second gate-on voltage.

12. The display device of claim 4, wherein:
each first stage includes a first transistor, which is connected between the first output terminal and a first gate-off voltage, and which turns on the first transistor in response to the first voltage of the third clock terminal unless the voltage of the second output terminal of the corresponding second stage is the second gate-on voltage; and
each second stage includes a second transistor, which is connected between the second output terminal and a second gate-off voltage, and which turns on the second transistor in response to the first voltage of the third clock terminal unless a voltage of the second output terminal is the second gate-on voltage.

13. The display device of claim 4, wherein:
each first stage includes a first transistor, which is connected between the first output terminal and a first gate-off voltage; and
each second stage includes a second transistor, which is connected between the second output terminal and a second gate-off voltage, and which turns on the first and second transistors in response to the first voltage of the third clock terminal unless a voltage of the second output terminal is the second gate-on voltage.

14. The display device of claim 1, wherein the first gate line, the second gate line, and the gate driver are integrated on one substrate.

15. A driving device of a display device, the display device including a plurality of first gate lines which sequentially transmits a first gate signal having a first gate-on voltage, and a plurality of second gate lines which sequentially transmits a second gate signal having a second gate-on voltage, each of the plurality of the second gate lines respectively forming a pair with each of the first gate lines, the driving device comprising:
a plurality of first stages each having a first output terminal which transmits the first gate signal to a corresponding first gate line from among each of the first gate lines; and
a plurality of second stages each having a second output terminal which transmit the second gate signal to a corresponding second gate line from among each of the second gate lines, and a carry output terminal configured to output a carry signal corresponding to the second gate signal,
wherein each first stage includes:
a first transistor connected between a first clock terminal and the first output terminal, and having a gate connected to a first junction point,
a second transistor which transmits a third gate-on voltage to the first junction point in response to the third gate-on voltage of the carry signal of a previous second stage, and
a first capacitor connected between a gate and a source of the first transistor, the first capacitor stores the third gate-on voltage, and
each second stage includes:
a third transistor connected between a second clock terminal and the second output terminal, and having a gate connected to a second junction point,
a fourth transistor which transmits the third gate-on voltage to the second junction point in response to the third gate-on voltage of the carry signal of the previous second stage, a second capacitor connected between a gate and a source of the third transistor, the second capacitor stores the third gate-on voltage, and
a fifth transistor connected between the second clock terminal and the carry output terminal, and having a gate connected to the second junction point.

16. The driving device of claim 15, wherein:
a first clock signal is input to the first clock terminal of one of two neighboring first stages, and a second clock signal is input to the first clock terminal of the other of the two neighboring first stages; and
a third clock signal is input to the second clock terminal of one of two neighboring second stages, and a fourth clock signal is input to the second clock terminal of the other of the two neighboring second stages.

17. The driving device of claim 16, wherein:
cycles of the first to fourth clock signals are substantially similar with one another, and the first to fourth clock signals are alternately set to have a first voltage and a second voltage;
a period having the first voltage of the first and second clock signals is smaller than a period of the second voltage, and a phase difference of the first and second clock signals is approximately 180 degrees; and
a duty ratio of the third and fourth clock signals is approximately 50%, and the phase difference of the third and fourth clock signals is approximately 180 degrees.

18. The driving device of claim 16, wherein:
each first stage further includes:
a sixth transistor which discharges the first capacitor in response to the second gate-on voltage of a next second stage, and
a seventh transistor which transmits a gate-off voltage to the first output terminal in response to the second gate-on voltage of the next second stage; and
each second stage further includes:
an eighth transistor which discharges the second capacitor in response to the second gate-on voltage of a next second stage, and
a ninth transistor which transmits the gate-off voltage to the second output terminal in response to the second gate-on voltage of the next second stage.

19. The driving device of claim 16, wherein:
each first stage further includes:
a sixth transistor connected between a gate-off voltage and the first output terminal, and having a gate connected to a third clock terminal, and
a seventh transistor connected between the first junction point and the first output terminal, and having a gate connected to the first clock terminal; and
each second stage further includes:
an eighth transistor connected between the gate-off voltage and the second output terminal, and having a gate connected to a fourth clock terminal, and
a ninth transistor connected between the second junction point and the second output terminal, and having a gate connected to the second clock terminal,
wherein the second clock signal is input to the third clock terminal when the first clock signal is input to the first clock terminal, and the first clock signal is input to the third clock terminal when the second clock signal is input to the first clock terminal, and
the fourth clock signal is input to the fourth clock terminal when the third clock signal is input to the second clock terminal, and the third clock signal is input to the fourth clock terminal when the fourth clock signal is input to the second clock terminal.

20. A driving method of a display device, the display device including a plurality of first gate lines which sequentially transmits a first gate signal having a first gate-on voltage, and a plurality of second gate lines which sequentially transmits a second gate signal having a second gate-on voltage, each of the second gate lines respectively forming a pair with each of the first gate lines, and a plurality of carry output terminals, each of said carry output terminals transmits a carry signal, the driving method comprising:

transmitting the second gate signal to a corresponding (i−1)th second gate line from among the plurality of second gate lines during a period in which an (i-1)th carry output terminal transmits the carry signal in correspondence with the second gate signal;

storing the carry signal and generating first and second gate-on voltages respectively transmitted to i-th first and second gate lines based on the stored carry signal from (i−1)th carry output terminal;

changing the first gate-on voltage output to the i-th first gate line to a gate- off voltage while maintaining the second gate-on voltage output to the i-th second gate line; and transmitting the gate-off voltage to the i-th first and second gate lines.

21. The driving method of claim 20, wherein the generation of the first and second gate-one voltages includes:

generating the first gate-on voltage, which is transmitted to the i-th first gate line, in response to a first voltage of a first clock terminal; and generating the second gate-on voltage, which is transmitted to the i-th second gate line, in response to the first voltage of a second clock terminal, wherein a first clock signal is input to the first clock terminal when i is an odd number and a second clock signal is input to the first clock terminal when i is an even number, and a third clock signal is input to the first clock terminal when i is an odd number and a fourth clock signal is input to the second clock terminal when i is an even number.

22. The driving method of claim 21, wherein:

cycles of the first to the fourth clock signals are substantially similar to one another, and the first to the fourth clock signals alternately have the first voltage and the second voltage;

a period having the first voltage of the first and second clock signals is smaller than a period of the second voltage, and a phase difference of the first and second clock signals is approximately 180 degrees; and a duty ratio of the third and fourth clock signals is approximately 50%, and a phase difference of the third and fourth clock signals is approximately 180 degrees.

23. The method of claim 22, wherein the changing of the first gate-on voltage includes changing the first gate-on voltage to the gate-off voltage in synchronization with the second voltage of the first clock terminal.

24. The driving method of claim 22, wherein the transmission of the gate-off voltage includes:

discharging the carry signal in synchronization with the second gate-on voltage, which is transmitted to the (i+1)-th second gate line; and transmitting the gate-off voltage to the i-th first and second gate lines.

25. The driving method of claim 24, wherein the transmission of the gate-off voltage further includes:

transmitting the gate-off voltage to the i-th first gate line in response to the first voltage of a third clock terminal; and transmitting the gate-off voltage to the i-th second gate line in response to the first voltage of a fourth clock terminal, wherein the second clock signal is input to the third clock terminal when i is an odd number, and the first clock signal is input to the third clock terminal when i is an even number, and the fourth clock signal is input to the fourth clock terminal when i is an odd number, and the third clock signal is input to the fourth clock terminal when i is an even number.

* * * * *